United States Patent [19]

Zerod

[11] Patent Number: 5,001,440
[45] Date of Patent: Mar. 19, 1991

[54] AUDIO AMPLIFIER LIMITING FOR A REMOTE POWER AMPLIFIER

[75] Inventor: Richard D. Zerod, Livonia, Mich.

[73] Assignee: Ford Motor Company, Dearborn, Mich.

[21] Appl. No.: 454,600

[22] Filed: Dec. 21, 1989

[51] Int. Cl.$^5$ ............................................. H03G 3/30
[52] U.S. Cl. ...................................... 330/284; 330/310
[58] Field of Search ............... 330/129, 133, 135, 149, 330/278, 279, 284, 150, 310, 311; 307/546, 547

[56] References Cited

U.S. PATENT DOCUMENTS

| | | | |
|---|---|---|---|
| 3,891,933 | 6/1975 | Suzuki et al. | 330/2 |
| 4,048,573 | 9/1977 | Evans et al. | 330/2 |
| 4,233,566 | 11/1980 | Nestorovic | 330/59 |
| 4,318,053 | 3/1982 | Sondermeyer | 330/281 |
| 4,581,589 | 4/1986 | Ikoma | 330/280 |
| 4,724,396 | 2/1988 | Taylor, Jr. et al. | 330/10 |
| 4,746,876 | 5/1988 | Sibiga | 330/284 |
| 4,786,879 | 11/1988 | Dolby | 330/284 X |
| 4,797,633 | 1/1989 | Humphrey | 330/310 X |

*Primary Examiner*—Steven Mottola
*Attorney, Agent, or Firm*—Mark Mollon; Paul K. Godwin

[57] ABSTRACT

An audio system having a main chassis including an audio preamplifier and a remote chassis including a power amplifier has a clipping level detector circuit in the remote chassis for detecting the onset of clipping by the power amplifier and has a gain control element in the main chassis for controlling the gain of the preamplifier. Thus, clipping distortion is eliminated without introduction of other distortion and while preserving the spectral balance of the audio signal.

11 Claims, 2 Drawing Sheets

AUDIO AMPLIFIER LIMITING FOR A REMOTE POWER AMPLIFIER

BACKGROUND OF THE INVENTION

The present invention relates in general to audio systems which prevent distortion from amplifier clipping by employing voltage limiting, and more specifically to automotive audio systems in which power amplification of an audio signal is performed in a location remote from a main audio unit.

Typical audio reproduction systems include a variable-gain preamplification stage followed by a fixed-gain power amplifier which drives an output transducer such as a speaker. A volume control voltage provided to the variable-gain stage controls the output volume heard by a listener.

An important objective in designing an audio system is to provide minimum distortion in signal reproduction. However, there is always some distortion, especially at high sound levels. As the magnitude of the signal provided from the variable-gain preamplifier stage to the power amplifier increases above a certain level, the power amplifier becomes overdriven. This situation occurs when the input signal to the power amplifier multiplied by the fixed-gain of the power amplifier approaches the supply voltage provided to the power amplifier. As a result, the power amplifier becomes saturated and the signal peaks of the audio signal are distorted by clipping. The variable-gain preamplifier is also susceptible to clipping, but the power amplifier is likely to begin clipping first.

The problem of clipping is severe in automotive audio systems. Less voltage headroom (i.e., safety margin) is available to the power amplifier since the automobile is limited to a 12-volt electrical supply. Although a DC/DC converter can be used to obtain a higher DC voltage, such converters are relatively expensive. Also, bass boost is needed in the automotive environment to mask low frequency road and engine noise, making clipping more likely.

High performance automotive audio systems typically employ a power amplifier located remote from the main audio unit in the dashboard, where it is not visible to the occupants of the automobile. A remotely located power amplifier saves space in the dashboard and reduces the amount of heat that would otherwise be generated in the main unit.

When the two amplifier stages are not located together, the problem of clipping of each amplifier stage has been handled individually in the prior art. Therefore, either one or both amplifier stages have been provided with voltage limiting in order to reduce distortion from signal clipping.

In a voltage limiting amplifier, whenever the amplifier output exceeds a predetermined referenced voltage, the input signal to that amplifier stage is attenuated in order to ensure that the amplifier is not overdriven. In the prior art remote power amplifier systems, unless both the variable-gain amplifier in the main unit and the power amplifier in the remote unit are separately provided with voltage limiting, clipping distortion can result at sufficiently high input signal levels or gain levels, and once distortion is introduced into the signal it cannot be removed.

An audio system employing voltage limiting amplifiers in both the main variable-gain preamplifier and the remote power amplifier avoids clipping distortion, but at the expense of an additional source of distortion referred to as modulation-type distortion. The gain reduction elements employed in the voltage limiting feedback circuits necessarily have time constants characteristic of their operation. Specifically, there are attack times and release times which govern the gain reduction. It is relatively difficult and expensive to provide perfectly matched attack and release times in the two independent limiters acting in series, and any mismatch in attack and release times creates distortion in the audio signal.

SUMMARY OF THE INVENTION

It is a principal object of the present invention to eliminate clipping distortion from an audio system without introducing any new source of distortion.

It is another object of the present invention to provide clipping protection for an audio system including a main chassis having a preamplifier and a remote stage having a power amplifier.

It is a further object of the invention to provide a method for preventing distortion in an audio system and for preventing clipping in both a main chassis preamplifier and a remote stage power amplifier without introducing modulation type distortion caused by unmatched attack and release times.

According to the present invention, these and other objects are achieved by employing a voltage limiting amplifier arrangement in which the output of the remote power amplifier is monitored to detect the onset of clipping. However, the gain of the power amplifier itself is not altered in response to the detection of clipping. Rather, a clipping feedback signal is provided from the remote clipping detector to a gain reduction circuit which operates on the main chassis preamplifier. This substantially eliminates clipping problems for both amplifiers. However, it may also be desirable to provide a second clipping detector to monitor the output of the preamplifier. This second clipping detector activates the same gain reduction circuit.

More specifically, the invention provides an audio system for amplifying an audio signal comprising a main chassis, an audio line, and a remote amplifier stage. The main chassis includes preamplifier means for amplifying the audio signal and gain control means coupled to the preamplifier means for reducing the magnitude of the audio signal at the output of the preamplifier means in response to a gain reduction signal. Preferably, the reduction of the preamplifier output is achieved by attenuating the preamplifier input. Alternatively, the reduction can be achieved by lowering the gain factor of the preamplifier. The audio line transmits the audio signal from the preamplifier means to the remote amplifier stage. The remote amplifier stage includes power amplifier means coupled to the audio line for amplifying the audio signal by a substantially fixed-gain. It also includes first clip detector means coupled to the output of the power amplifier means for generating a gain reduction signal whenever signal clipping occurs in the remote amplifier stage. Preferably, the audio system further includes a control line for transmitting the gain reduction signal from the first clip detector to the gain control means. Furthermore, the main chassis may further include second clip detector means coupled to the output of the preamplifier means for generating its own gain reduction signal whenever signal clipping occurs in the preamplifier means. Thus, clipping distortion is eliminated by provision of voltage limiting while modulation-type distortion is avoided since there is only one attack and one release time introduced into the circuit (there being only one gain reduction element).

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

DETAILED DESCRIPTION OF PREFERRED EMBODIMENTS

Figure 1:
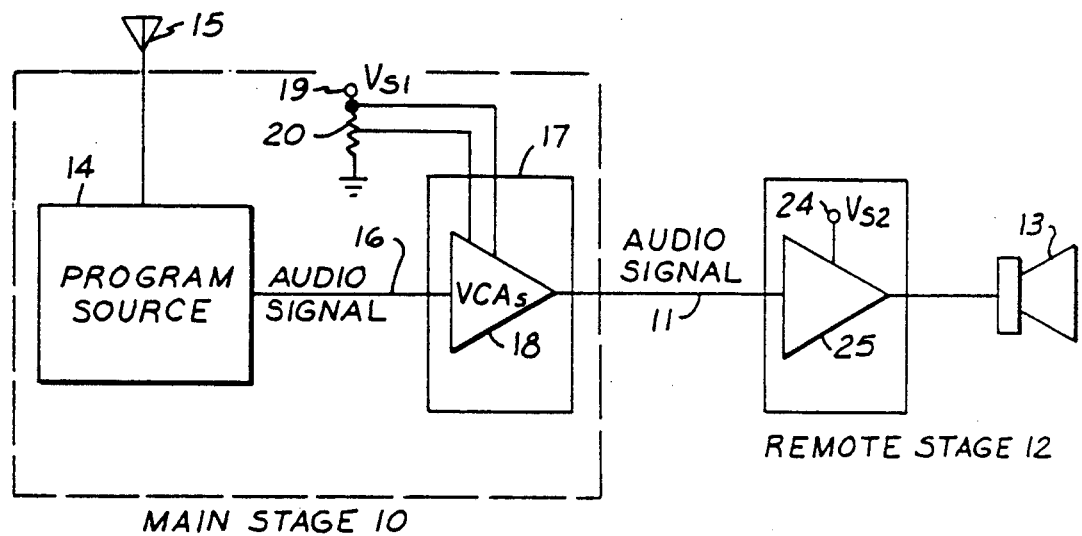
FIG. 1 is a block diagram showing an audio system having a remote power amplifier as is used in the present invention.

Referring to FIG. 1, a main chassis 10 transmits an audio signal on an audio line 11 to a remote stage 12. The audio signal may typically include front and rear stereo signals for a total of four separate signals. Audio line 11 would then include four separate signal lines. Remote stage 12 drives a speaker 13.

Main chassis 10 includes a program source 14 which preferably includes a radio tuner connected to an antenna 15, a cassette tape player, a CD player, or the like. An audio signal is provided from program source 14 over an audio line 16 to a voltage controlled amplifier (VCA) 18. Although four audio signals may actually be present, a single audio line 16 is shown for simplicity of explanation. VCA 18 is preferably included as part of a tone/volume control integrated circuit 17, such as the TDA1524A integrated circuit manufactured by Philips. A supply voltage $V_{s1}$ is provided to a terminal 19. Terminal 19 is connected to a power supply input of VCA 18 and to a grounded potentiometer 20. The adjustable tap of potentiometer 20 is connected to a volume control input of VCA 18 for controlling the signal gain provided by VCA 18.

The audio signal provided by the output of VCA 18 is transmitted over audio line 11 to the input of a power amplifier 25 in remote stage 12. Power amplifier 25 is connected to supply voltage $V_{s2}$ provided at a terminal 24.

VCA 18 may preferably include separate amplifier sections for controlling wideband volume and relative bass and treble levels. In operation, the audio signal provided by program source 14 is amplified by VCA 18 according to a volume control voltage provided by potentiometer 20 and according to tone control voltages provided by other potentiometers (not shown). The amplified audio signal provided on line 11 to power amplifier 25 is amplified by a fixed-gain to drive speaker 13.

Figure 2:
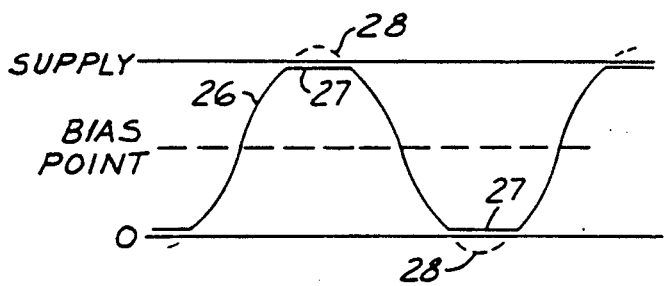
FIG. 2 is a waveform diagram illustrating the occurrence of signal clipping.

FIG. 2 illustrates how clipping could occur at the outputs of either the main chassis VCA 18 or power amplifier 25. The output of a DC amplifier can swing between voltage values of zero and the supply voltage $V_s$ to the amplifier. An audio signal waveform 26 oscillates around a bias point of the amplifier that is generally midway between zero and the supply voltage. Whenever the audio input signal to the amplifier times the amplifier gain equals a value outside the maximum amplifier swing, the waveform is clipped at 27 rather than following its ideal path 28.

Figure 3:
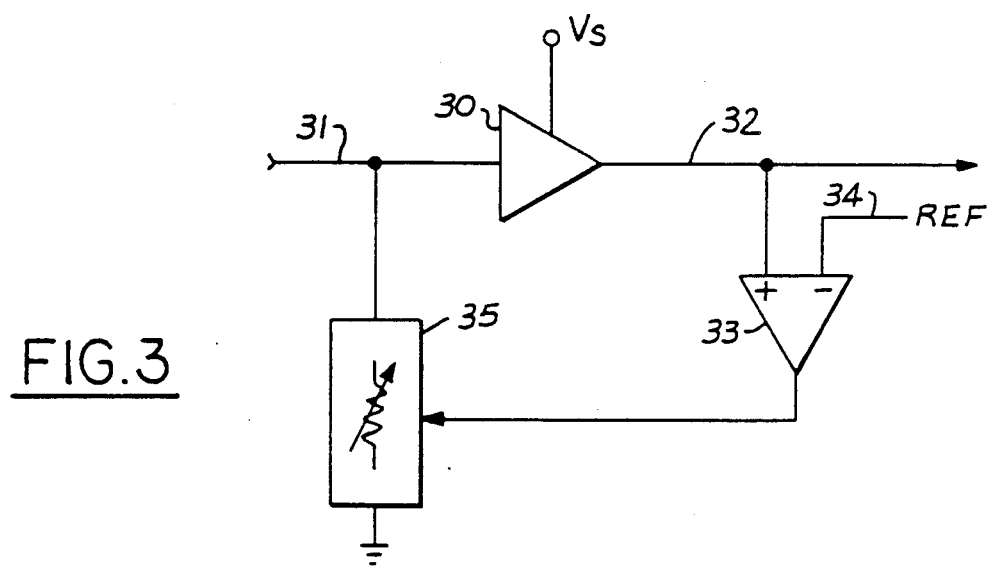
FIG. 3 is a schematic diagram showing a typical voltage limiting circuit.

In order to prevent clipping, an amplifier voltage limiting feedback circuit can be employed, as shown in FIG. 3. An amplifier 30 receives an audio input signal on an input line 31 and provides an amplified audio output signal on an output line 32. Amplifier 30 is provided with a supply voltage $V_s$. Output line 32 is connected to the noninverting input of a comparator 33. The inverting input of comparator 33 is connected to a reference voltage REF which is a positive voltage that is just slightly less than supply voltage $V_s$. The output of comparator 33 is connected to a control input of a variable impedance or variable attenuator 35 which provides a controlled resistance between input line 31 and ground.

In operation, amplifier 30 provides an amplification gain factor to an audio signal input on line 31. Whenever the gain factor applied by amplifier 30 results in an output signal on line 32 having an amplitude greater than the reference voltage REF on line 34, the output voltage supplied by comparator 33 switches to a high level to indicate the onset of clipping. The high voltage level generated by comparator 33 provides a control signal that is integrated by attenuator 35 according to its attack and release times. Attenuator 35 reduces its variable resistance such that a portion of the input signal on line 31 is shunted to ground, thereby reducing the input signal to amplifier 30 and the magnitude of the output signal provided on line 32. Thus, the amplifier gain provided by the combination of the amplifier and the voltage limiting circuit is automatically adjusted to an amount which is at a maximum with no clipping, subject to proper selection of attack and release times of the attenuator circuit.

The attack time is the amount of time required before the gain reduction circuit responds to an overdrive condition. Release time is the lag between the disappearance of an overdriving input condition and the return of the variable attenuator to its maximum impedance state. Although attack and release times are unavoidable and can be beneficial, it has not been possible to conveniently match attack and release time in individual limiting circuits operating in series used in the prior art.

Figure 4:
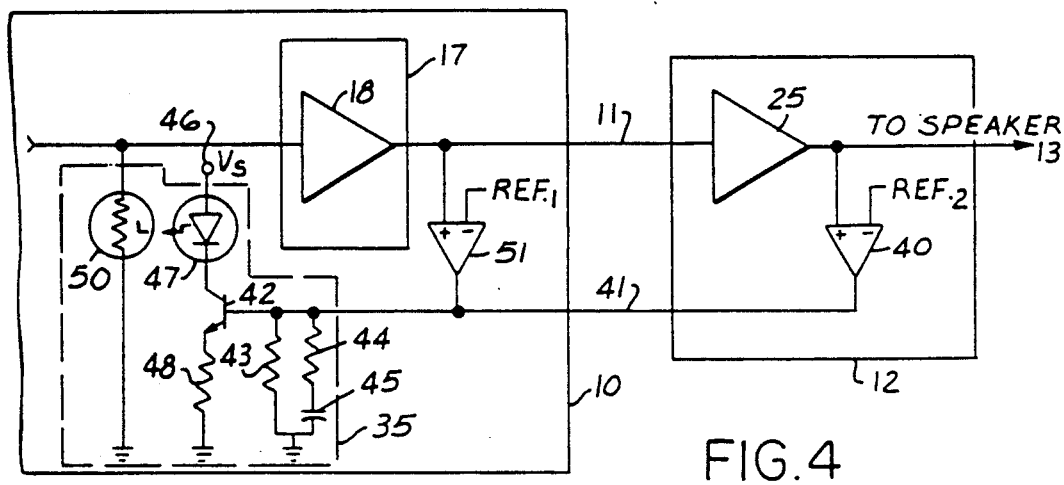
FIG. 4 is a part schematic, part block diagram showing a preferred embodiment of the voltage limiting circuit of the present invention.

The improved amplifier configuration of the present invention shown in FIG. 4 employs a single attenuator 35 connected to the input of main chassis VCA preamplifier 18. Attenuator 35 is controlled according to the outputs of both main chassis VCA 18 and remote power amplifier 25. A comparator 40 has its noninverting input connected to the output of amplifier 25, in remote stage 12, and has its inverting input connected to reference voltage $REF_2$. The output of comparator 40 is connected to attenuator 35 via a control line 41 running from remote stage 12 to main chassis 10.

Another comparator 51 is located in main chassis 10 and has its noninverting input connected to the output of VCA 18. Its inverting input is connected to its own reference voltage $REF_1$. The output of comparator 51 is connected to control line 41. Control line 41 is connected to the base of a transistor 42 in attenuator 35. The base of transistor 42 is also connected to a biasing network comprising a resistor 43 in parallel with the series combination of a resistor 44 and a capacitor 45 to ground. The collector of transistor 42 is connected to the cathode of a light emitting diode (LED) 47. The anode of LED 47 is connected to terminal 46 where voltage $V_s$ is supplied. The emitter of transistor 42 is coupled to ground through a resistor 48. A light dependent resistor (LDR) 50 is connected between input line 16 and ground. LED 47 and LDR 50 are located in close proximity or are joined by a light transmitting path whereby light emitted from LED 47 causes a predetermined reduction in the resistance of LDR 50. In operation, comparators 40 and 51 generate a relatively high voltage on (or supply a current to) control line 41 upon the onset of clipping in their respective amplifiers. The high signal on line 41 charges capacitor 45 through resistor 44 until the turn-on voltage of transistor 42 is reached and transistor 42 conducts. When the outputs of the comparators both return to a low voltage, capacitor 45 discharges through resistors 43 and 44, eventually causing transistor 42 to become nonconductive. Thus, resistors 43 and 44 and capacitor 45 provide a desired attack and release time for the limiting function.

When transistor 42 is biased into a conducting state, current flows through LED 47 which generates light. The light is directed to LDR 50, thereby decreasing the resistance of LDR 50. The decreased resistance of LDR 50 shunts a portion of the input signal on line 16 away from VCA 18 and to ground. This results in a reduced output from VCA 18. The output of power amplifier 25 is also reduced since its input from VCA 18 was reduced.

The input signal to VCA 18 is attenuated in response to clipping occurring in either VCA 18 or power amplifier 25. The amount of attenuation provided by attenuator 35 is sufficient to eliminate clipping of either or both amplifiers. However, it may, in some instances, be desirable to eliminate comparator 51 and to attenuate the input signal to VCA 18 in response only to clipping in power amplifier since power amplifier 25 typically enters a clipping condition before VCA 18 does.

Figure 5:
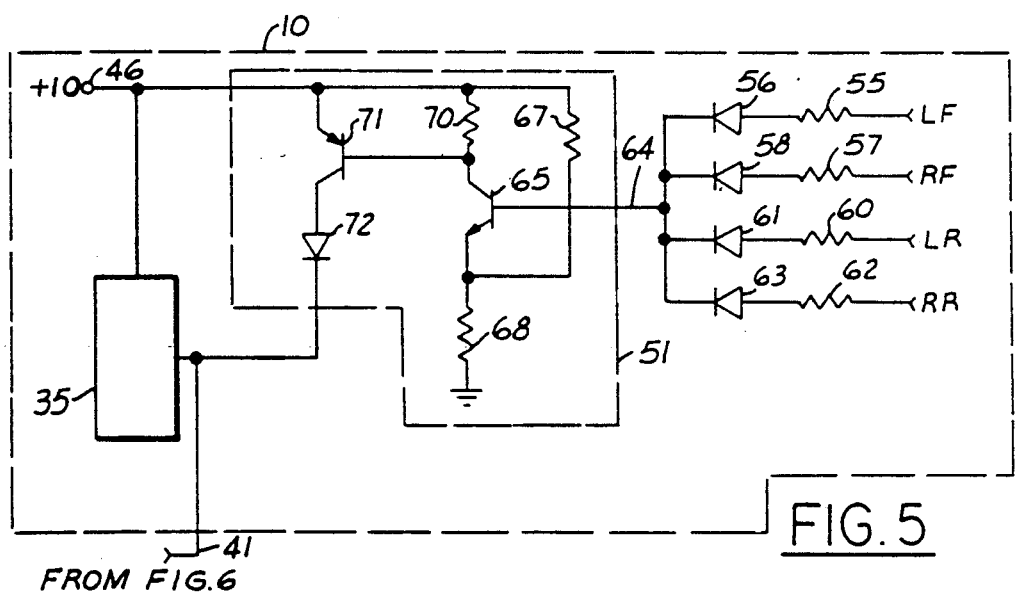
FIG. 5 is a schematic diagram showing a clip detector circuit of the present invention in greater detail.

The output of VCA 18 in tone/volume control integrated circuit 17 typically comprises four channels, including left-front (LF), right-front (RF), left-rear (LR), and right-rear (RR). These channels are shown in the clip detector circuit of FIG. 5.

In order to derive the instantaneous peak voltage on any individual channel, all channels feed into comparator 51 from a common point 64. The audio signal on LF is coupled to point 64 through a resistor 55 and a forward-connected diode 56. The audio signal on RF is coupled to point 64 through a resistor 57 and a forward-connected diode 58. The audio signal on LR is coupled to point 64 through a resistor 60 and a forward-connected diode 61. The audio signal on RR is coupled to point 64 through a resistor 62 and a forward-connected diode 63. Common point 64 is connected to the base of an NPN transistor 65 in comparator circuit 51. The emitter of transistor 65 is connected to the junction of a pair of voltage dividing resistors 67 and 68 which divide the 10 volt supply voltage at terminal 46. The collector of transistor 65 is connected to a resistor 70 which is also connected to terminal 46. The collector of transistor 65 is also connected to the base of a PNP transistor 71. Transistor 71 has its emitter connected to terminal 46 and its collector connected to the anode of a diode 72. The cathode of diode 72 is connected to line 41.

In operation, the peak voltage appearing on point 64 from all the channels is compared to the emitter voltage of transistor 65 which is determined by the voltage divider comprising resistors 67 and 68. Thus, the reference voltage is a percentage of the 10-volt supply voltage. When the peak voltage from any audio channel exceeds the reference voltage plus the turn-on threshold of transistor 65, transistor 65 enters a conducting state thereby reducing the voltage at its collector. Thus, the base voltage of transistor 71 is reduced to a point where transistor 71 also conducts The current through transistor 71 passes through diode 72 and charges the attenuator capacitor as previously described.

Figure 6:
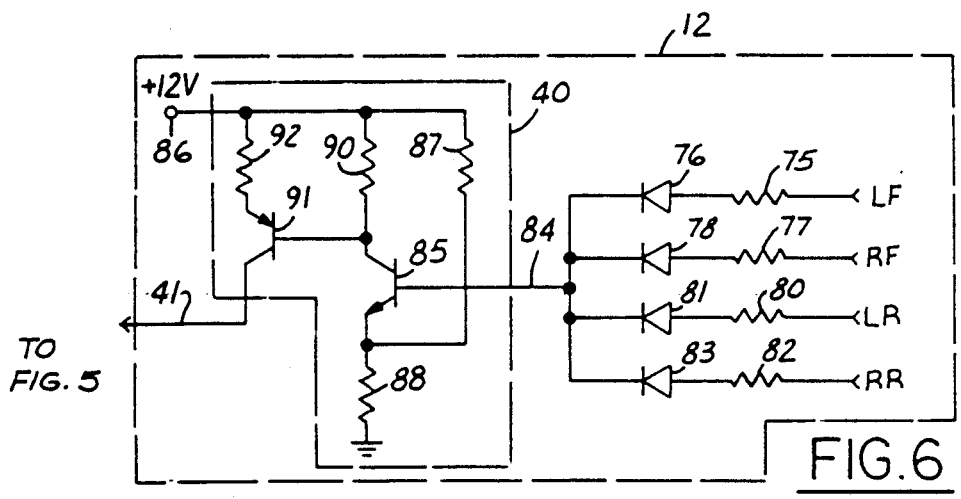
FIG. 6 is a schematic diagram of a clip detector employed in the remote amplifier stage of the present invention.

Comparator circuit 40 shown in FIG. 6 is employed in remote amplifier stage 12. The four audio signals of the power amplifier are respectively coupled to a summing point 84 through resistors 75, 77, 80, and 82, correspondingly connected with forward-connected diodes 76, 78, 81, and 83, as shown. Summing point 84 is connected to the base of an NPN transistor 85 in comparator circuit 40. The emitter of transistor 85 is connected to the junction of a pair of voltage dividing resistors 87 and 88 which divide the 12 volt supply voltage of the remote power amplifier stage at terminal 86. The collector of transistor 85 is connected to a resistor 90 which is also connected to terminal 86. The collector of transistor 85 is also connected to the base of a PNP transistor 91. Transistor 91 has its emitter connected to a resistor 92 which is also connected to terminal 86. The collector of transistor 91 is connected to line 41.

Whenever the peak voltage from a power amplifier channel at summing point 84 exceeds the reference voltage provided by the voltage divider of resistors 87 and 88, plus the turn-on threshold of transistor 85, transistors 85 and 91 enter their conducting states and a high output signal results on control line 41. The high signal on line 41 then causes a reduced gain in the main chassis preamplifier as previously described.

Although a variable attenuator has been shown in the preferred embodiments hereof, gain reduction of the main chassis preamplifier could be achieved by directly manipulating the gain factor of the preamplifier. For example, a preamplifier can be used having a gain factor controlled by a digital value written by software to a control associated with the preamplifier. The TDA7306 integrated circuit manufactured by SGS-Thomson Microelectronics provides such a preamplifier.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An audio system for amplifying an audio signal comprising:
   a main chassis including preamplifier means for , amplifying said audio signal and gain control means coupled to said preamplifier means for reducing the magnitude of said audio signal output by said preamplifier means in response to a gain reduction signal;

at least one audio line for transmitting said audio signal from said preamplifier means; and a remote amplifier stage receiving said audio signal and including power amplifier means coupled to said audio line for amplifying said audio signal by a substantially fixed gain and first clip detector means coupled to said power amplifier means and said gain control means for generating said gain reduction signal whenever signal clipping occurs in said remote amplifier stage.

2. The system of claim 1 further comprising a control line coupling said first clip detector and said gain control means for transmitting said gain reduction signal.

3. The system of claim 1 wherein said gain control means is comprised of a variable attenuator connected to receive said audio signal in parallel with said preamplifier means and to shunt a portion of said audio signal away from the input of said preamplifier means in response to said gain reduction signal.

4. The system of claim 3 wherein said variable attenuator is comprised of a light dependent resistor.

5. The system of claim 1 wherein said main chassis further includes second clip detector means coupled to said preamplifier means and said gain control means for generating said gain reduction signal whenever signal clipping occurs in said preamplifier means.

6. The system of claim 1 further comprising a program source for generating said audio signal.

7. The system of claim 1 further comprising an output speaker coupled to said power amplifier means.

8. A system for preventing clipping distortion in an audio system that includes a main audio signal preamplifier chassis and a remotely located power amplifier chassis and an audio transducer, comprising:

preamplifier means in said preamplifier chassis for controllably amplifying an audio signal received at its input;

power amplifier means in said power amplifier chassis for amplifying said preamplified audio signal from said preamplifier means and generating an output signal for driving said audio transducer;

means located in said power amplifier chassis for detecting the occurrence of clipping in the output signal of said power amplifier and responsively outputting a gain reduction signal when clipping is detected;

means located in said preamplifier chassis for receiving said gain reduction signal and responsively controlling the level of audio signal input to said preamplifier; and means for transmitting said audio signal and said gain reduction signal between said preamplifier chassis and said power amplifier chassis.

9. A method of preventing distortion in an audio system including a preamplifier on a main chassis providing an audio signal to a remote amplifier stage, said method comprising the steps of:

detecting the onset of clipping in said remote amplifier stage;

conducting a signal from said remote amplifier to said main chassis to indicate the onset of clipping; and reducing the magnitude of said audio signal in said main chassis in response to said signal, whereby clipping in said remote amplifier is prevented.

10. The method of claim 9 wherein said gain reducing step is comprised of attenuating the input signal to said preamplifier.

11. The method of claim 9 further comprising the steps of:

detecting the onset of clipping in said main chassis; and reducing the magnitude of said audio signal in said main chassis in response to the onset of clipping in said main chassis.

* * * * *